(12) United States Patent
Sugiyama et al.

(10) Patent No.: US 7,196,417 B2
(45) Date of Patent: Mar. 27, 2007

(54) METHOD OF MANUFACTURING A LOW EXPANSION MATERIAL AND SEMICONDUCTOR DEVICE USING THE LOW EXPANSION MATERIAL

(75) Inventors: Tomohei Sugiyama, Aichi-ken (JP); Kyoichi Kinoshita, Aichi-ken (JP); Takashi Yoshida, Aichi-ken (JP); Hidehiro Kudo, Aichi-ken (JP); Eiji Kono, Aichi-ken (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 223 days.

(21) Appl. No.: 10/626,418

(22) Filed: Jul. 23, 2003

(65) Prior Publication Data

US 2004/0130018 A1 Jul. 8, 2004

(30) Foreign Application Priority Data

Jul. 30, 2002 (JP) .............................. 2002-221092
May 9, 2003 (JP) .............................. 2003-131402

(51) Int. Cl.
*H01L 23/34* (2006.01)
(52) U.S. Cl. ........................ 257/720; 257/675; 257/706
(58) Field of Classification Search ................ 257/675, 257/706, 717, 734, 720
See application file for complete search history.

(56) References Cited

U.S. PATENT DOCUMENTS 5,006,417 A * 4/1991 Jackson et al. ............. 428/614
6,154,364 A * 11/2000 Girrens et al. .............. 361/704
6,318,442 B1 11/2001 Cornie ........................ 164/97
6,507,105 B1 * 1/2003 Yamagata et al. .......... 257/720
6,569,524 B2 * 5/2003 Kawai et al. ............... 428/375
6,811,761 B2 * 11/2004 Brese et al. ................ 423/345

FOREIGN PATENT DOCUMENTS

| DE | 101 22 744 | 11/2002 |
|---|---|---|
| EP | 0 813 243 | 12/1997 |
| EP | 1 086 937 | 3/2001 |
| EP | 1 284 250 | 2/2003 |
| EP | 1 287 928 | 3/2003 |
| EP | 1 375 688 | 1/2004 |
| JP | 6-268114 | 9/1994 |
| JP | 11-170027 | 6/1999 |
| JP | 2001-181066 | 7/2001 |
| WO | 94/02654 | 2/1994 |

* cited by examiner

*Primary Examiner*—Doug Menz
(74) *Attorney, Agent, or Firm*—Morgan & Finnegan, L.L.P.

(57) ABSTRACT

A mold is filled with unsintered SiC particles and a melt of Al or of an Al alloy containing Si is poured into the mold for high pressure casting. Owing to the SiC particles and Si precipitated upon casting, a low expansion material having a low thermal expansion coefficient is produced. A heat transmission path is formed by Al infiltrating spaces between the SiC particles and therefore high heat conductivity is obtained.

2 Claims, 5 Drawing Sheets

METHOD OF MANUFACTURING A LOW EXPANSION MATERIAL AND SEMICONDUCTOR DEVICE USING THE LOW EXPANSION MATERIAL

BACKGROUND OF THE INVENTION

1. Field of the Invention

The present invention relates to a method of manufacturing a low expansion material, and more specifically, to a method of manufacturing a material with low thermal expansion coefficient having excellent heat conductivity.

The present invention also relates to a semiconductor device using a substrate made of this low expansion material.

2. Description of the Related Art

Figure 9:
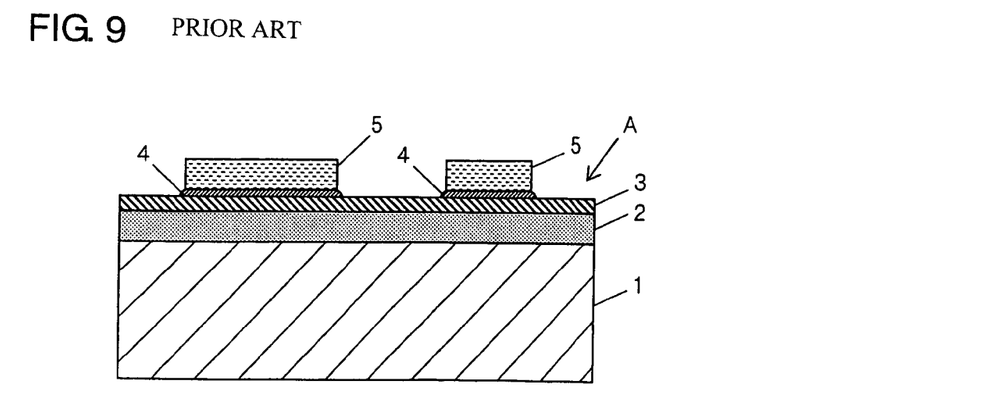
FIG. 9 is a sectional view showing the structure of a conventional semiconductor device.

The structure of a conventional semiconductor device is shown in FIG. 9. On a surface of a substrate 1 formed of Al, an insulating layer 2 and a wiring layer 3 are sequentially formed to obtain an Al circuit board A. A semiconductor element 5 is joined through solder 4 to the top face of the wiring layer 3.

Because the substrate 1 is formed of Al which has excellent heat conductivity, heat generated in the semiconductor element 5 is transmitted through the wiring layer 3 and the insulating layer 2 to the substrate 1 and is then efficiently radiated from the substrate 1 to the outside.

However, there is a large difference in thermal expansion coefficient between Si or other semiconductor material used in the semiconductor element 5 and Al forming the substrate 1. This difference is known to bring thermal stress between the Al circuit board A and the semiconductor element 5 upon temperature shift. When the thermal stress is large, the semiconductor element 5 could be warped and the solder 4 for joining the semiconductor element 5 may be cracked.

In an attempt to ease this thermal stress, semiconductor devices used in an environment with a wide temperature range, for example, automobiles, have a stress relieving member such as a heat spreader installed between the semiconductor element 5 and the Al circuit board A.

Installing such stress relieving member, however, raises a problem of increased heat resistance of the entire semiconductor device as well as complication by an increase in number of parts of the semiconductor device.

JP 2001-181066A proposes to ease thermal stress in a semiconductor device by using a substrate formed of a low thermal expansion composite material, which is obtained by impregnating a SiC porous body with Al or an Al alloy. This method, however, also has problems of complicated manufacture process and high manufacture cost because SiC particles have to be molded and sintered together with a binder to obtain the porous body and the obtained SiC porous body has to be impregnated with molten Al or Al alloy.

SUMMARY OF THE INVENTION

The present invention has been made to solve the above problems, and an object of the present invention is therefore to provide a method of manufacturing a low expansion material which makes it possible to easily produce at low cost a low expansion material with low thermal expansion coefficient having excellent heat conductivity.

Another object of the present invention is to provide a semiconductor device that uses such low expansion material to ease thermal stress.

A method of manufacturing a low expansion material according to the present invention includes the steps of: filling a mold with unsintered SiC particles; and casting a melt of an Al material in the mold.

A first semiconductor device according to the present invention includes: a substrate formed of a low expansion material that is produced by the method described above; and a semiconductor element mounted onto the substrate.

A second semiconductor device according to the present invention includes: a circuit board; a heat spreader which is formed of a low expansion material produced by the method described above and is joined to the top face of the circuit board; and a semiconductor element mounted onto the heat spreader.

A third semiconductor device according to the present invention includes: a circuit board; a semiconductor element mounted onto the circuit board; and a heat releasing plate which is formed of a low expansion material produced by the method described above and is joined to the underside of the circuit board.

DETAILED DESCRIPTION OF THE PREFERRED EMBODIMENTS

Embodiment 1:

In a low expansion material manufacturing method according to Embodiment 1, unsintered Sic particles are first filled in a mold. The volume percentage of the SiC particles in the mold becomes high if a closest packing is employed to fill the mold as tightly as possible with two or more kinds of SiC particles which are different in grain size from one another. Raising the volume percentage of the SiC particles makes it possible to produce a low expansion material of lower thermal expansion coefficient since the thermal expan sion coefficient of SiC is $4.5 \times 10^{-6}$/K while pure Al (A1050) has a thermal expansion coefficient of $25.0 \times 10^{-6}$/K.

Into the mold filled with the SiC particles as described, a melt of Al or of an Al alloy containing Si is poured for high pressure casting to obtain the low expansion material. The obtained material has high heat conductivity because Al infiltrates spaces between the SiC particles and forms a heat transmission path.

Since a mold is filled with unsintered SiC particles and then Al or an Al alloy containing Si is cast, the manufacture process is simplified and the manufacture cost is reduced as well.

EXAMPLE 1

When SiC particles with a mean grain size of 100 μm and SiC particles with a mean grain size of 8 μm are mixed at a ratio of 7:3 and each of four molds is filled with the mixture, the volume percentage of SiC particles becomes 70%. In this state, as described in Table 1, low expansion materials of Samples S1 to S4 have been manufactured by using four Al materials which are different in Si content from one another and pouring melt of each Al material into one of the four molds for high pressure casting with the corresponding mold preheat temperature/melt temperature (hereinafter referred to as mold/melt temperature). The pre-heating of the molds is for enhancing the heat efficiency in casting.

TABLE 1

| Al material | Content percentage of Si [wt %] | Volume percentage of SiC [%] | Mold/melt temperature [° C.] | Thermal expansion coefficient [× $10^{-6}$/K] | Heat conductivity [W/mK] |
|---|---|---|---|---|---|
| S1 A1050 | 0 | 70 | 700/800 | 8.07 | 261 |
| S2 AC4C | 7 | 70 | 700/700 | 7.5 | 250 |
| S3 ADC14 | 17 | 70 | 800/800 | 6.66 | 210 |
| S4 AC9A | 23 | 70 | 950/950 | 6.26 | 204 |

In Sample S1, pure Al (A1050) is used and the mold/melt temperature is set to 700/800° C. for casting. In Sample S2, an Al alloy with an Si content of 7 wt % (AC4C) is used and the mold/melt temperature is set to 700/700° C. for casting. In Sample S3, an Al alloy with an Si content of 17 wt % (ADC14) is used and the mold/melt temperature is set to 800/800° C. for casting. In Sample S4, an Al alloy with an Si content of 23 wt % (AC9A) is used and the mold/melt temperature is set to 950/950° C. for casting. The mold preheat temperature and the melt temperature are set high for Sample S4 with the intention of accelerating the reaction of Al to SiC to precipitate Si which has a low thermal expansion coefficient.

Figure 1:
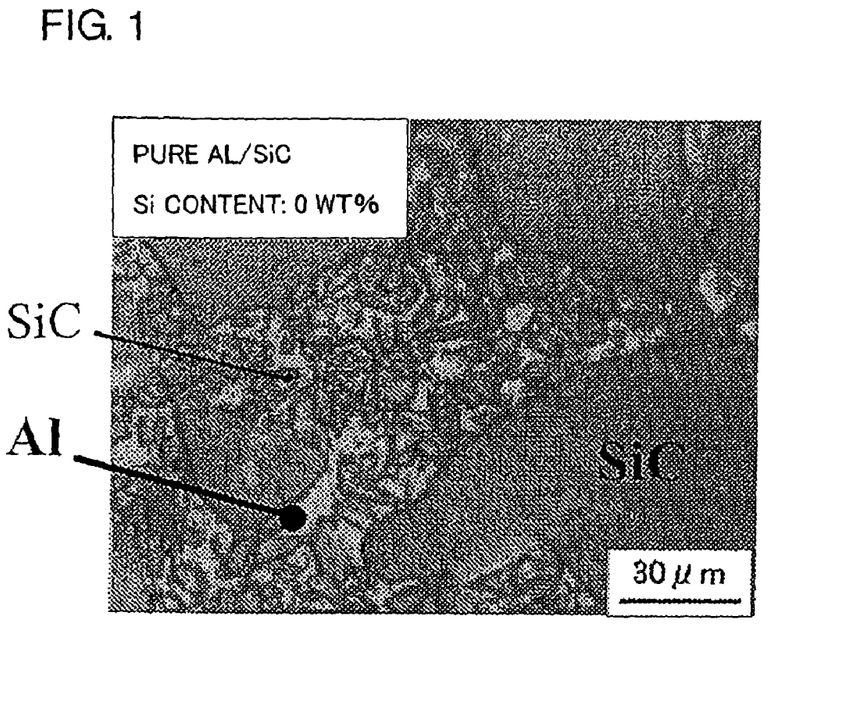
FIG. 1 is a microscopic picture of a low expansion material manufactured in accordance with Example 1 in Embodiment 1 of the present invention.

A microscopic picture of the low expansion material of Sample S1 is shown in FIG. 1. The picture shows the smaller SiC particles surrounding the larger SiC particles and Al infiltrating spaces between these SiC particles. Physical properties measured of the low expansion material of Sample S1 include a thermal expansion coefficient of $8.07 \times 10^{-6}$/K and a heat conductivity of 261 W/m·K. Compared to pure Al (A1050) which has a thermal expansion coefficient of $25.00 \times 10^{-6}$/K and a heat conductivity of 234 W/m·K, it is understood that the low expansion material of Sample S1 is greatly reduced in thermal expansion coefficient while maintaining as high heat conductivity as pure Al.

Figure 2:
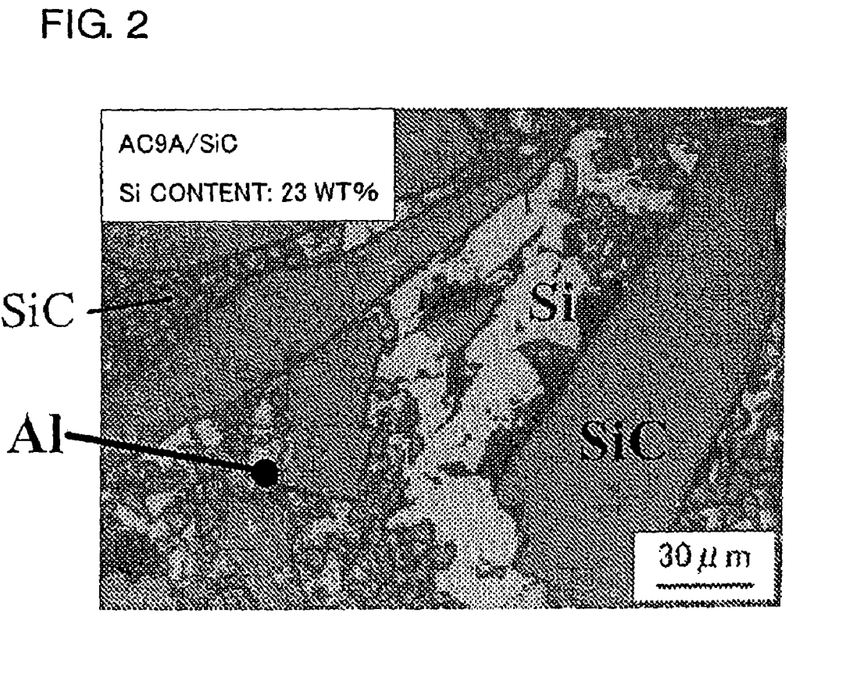
FIG. 2 is a microscopic picture of a low expansion material manufactured in accordance with Example 2 in Embodiment 1.

Similarly, a microscopic picture of the low expansion material of Sample S4 is shown in FIG. 2. The picture shows the smaller SiC particles surrounding the larger SiC particles and the existence of precipitated Si. Physical properties measured of the low expansion material of Sample S4 include a thermal expansion coefficient of $6.26 \times 10^{-6}$/K and a heat conductivity of 204 W/m·K. Owing to Si which is precipitated upon casting and which has as low thermal expansion coefficient as $2.6 \times 10^{-6}$/K, a low expansion material with a very low thermal expansion coefficient has been obtained.

Also, physical properties of the low expansion materials of Samples S2 and S3 have been measured to reveal that they have low thermal expansion coefficients and high heat conductivities as shown in Table 1.

Figure 3:
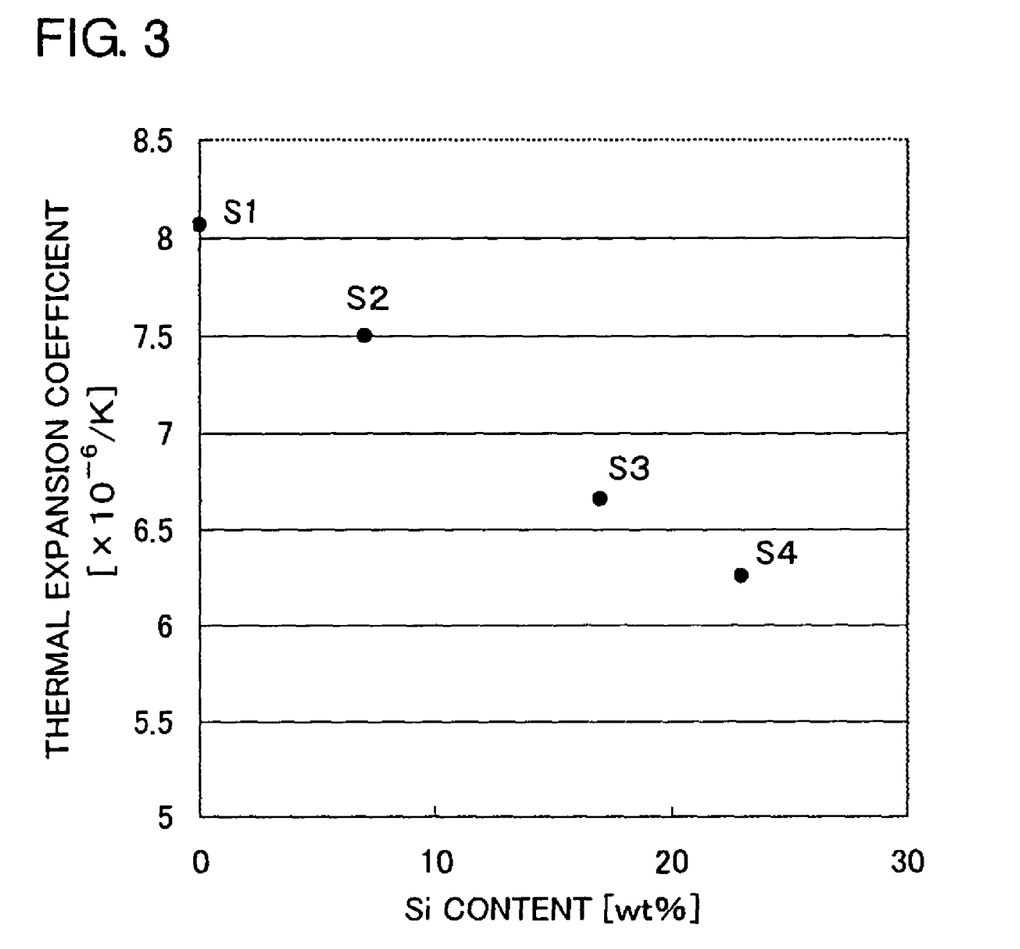
FIG. 3 is a graph showing the thermal expansion coefficient of the low expansion material in relation to the Si content of an Al material in Example 1.

The relation of the measured thermal expansion coefficient with respect to the Si content of the Al material for each of the low expansion materials of Samples S1 to S4 is shown in FIG. 3. The thermal expansion coefficient of the low expansion material produced is lowered as the Si content of the Al material is increased, and the thermal expansion coefficient has successfully been changed between $6 \times 10^{-6}$/K and $8 \times 10^{-6}$/K by adjusting the Si content of the Al material and the mold/melt temperature.

Figure 4:
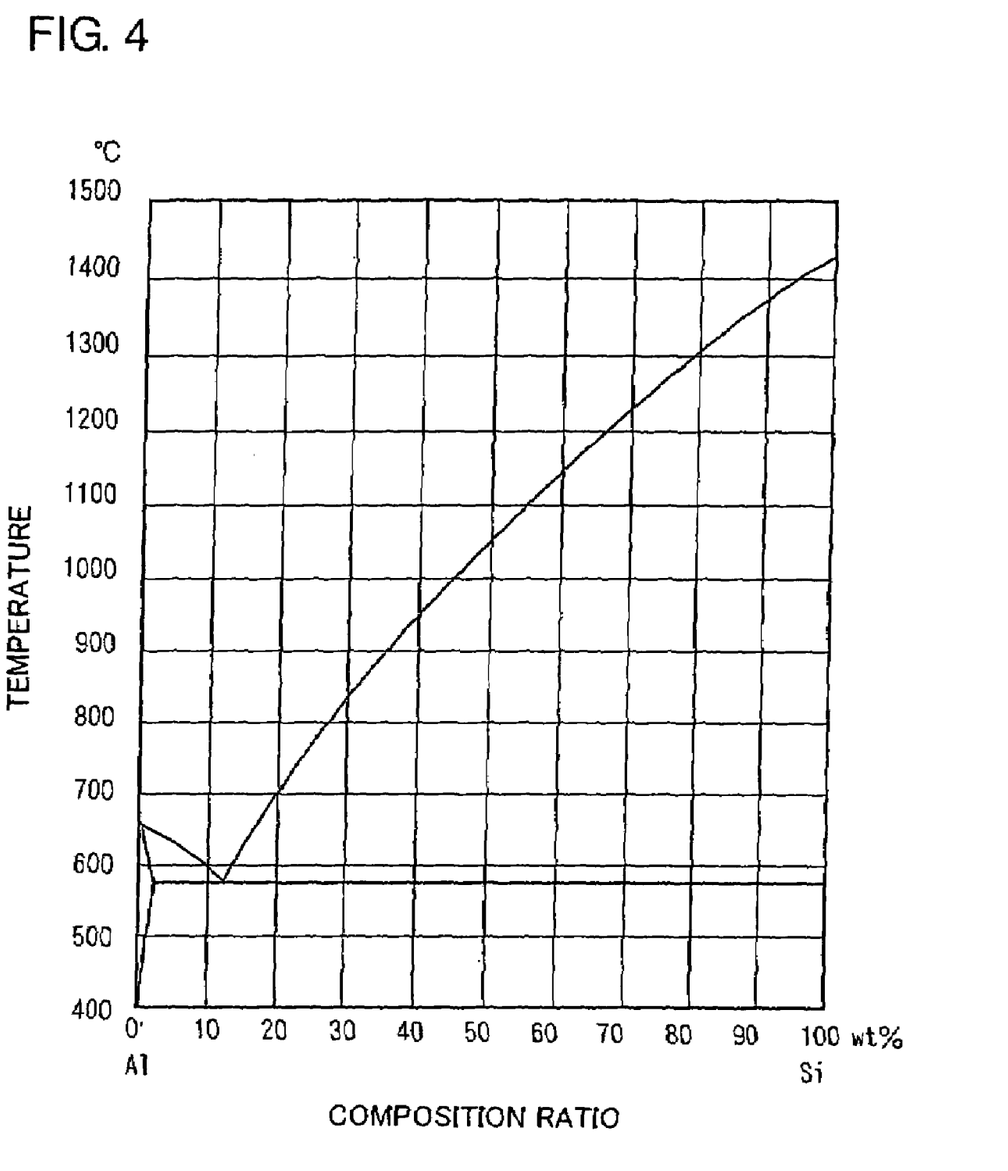
FIG. 4 is a diagram showing equilibrium for Al—Si.

FIG. 4 is a diagram showing equilibrium for Al—Si. When the Al—Si composition ratio in an Al material exceeds the eutectic point, Si precipitated from SiC enters the melt to raise the melting point of the Al material. Taking into account the rise in melting point due to the precipitation of Si, the melt temperature is preferably set higher than the melting point of the Al material by, for example, 50K or more.

EXAMPLE 2

As described in Table 2, low expansion materials of Samples S5 to S8 have been produced by mixing SiC particles with a mean grain size of 100 μm and SiC particles with a mean grain size of 8 μm at a varying mixture ratio in volume, filling molds with the mixtures, and pouring a melt of pure Al (A1050) into the molds for high pressure casting. The mixture ratios of the SiC particles with a mean grain size of 100 μm and the SiC particles with a mean grain size of 8 μm for Samples S5 to S8 are set to 7:3, 3:7, 9:1, and 10:0, respectively. The mold/melt temperature is set to

TABLE 2

| Al material | Mixture ratio in volume 100 μm:8 μm | Volume percentage of SiC [%] | Thermal expansion coefficient [× $10^{-6}$/K] | Heat conductivity [W/mK] |
|---|---|---|---|---|
| S5 A1050 | 7:3 | 70 | 8.07 | 261 |
| S6 A1050 | 3:7 | 54 | 11.7 | 240 |
| S7 A1050 | 9:1 | 65 | 10 | 281 |
| S8 A1050 | 10:0 | 56 | 12.1 | 281 |

Physical properties of the low expansion materials of Samples S5 to S8 have been measured to reveal that they have low thermal expansion coefficients and high heat conductivities as shown in Table 2.

Figure 5:
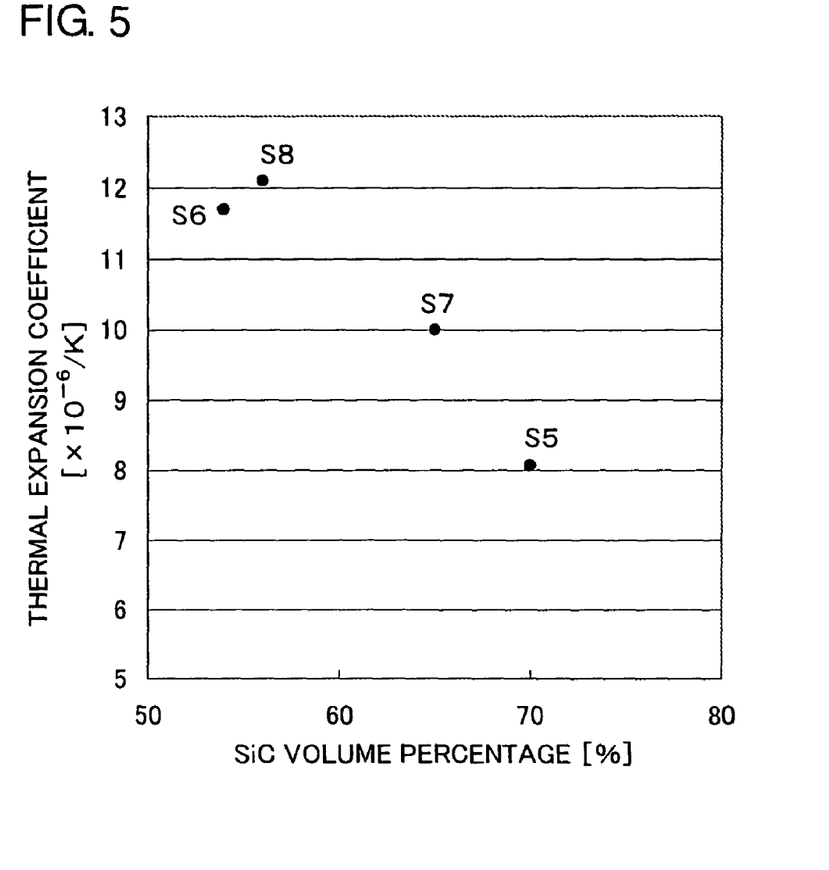
FIG. 5 is a graph showing the thermal expansion coefficient of the low expansion material in relation to the volume percentage of SiC particles in Example 2.

As shown in Table 2, the volume percentage of SiC particles in a mold varies depending on the mixture ratio in volume of the SiC particles. The relation of the measured thermal expansion coefficient with respect to the volume percentage of SiC particles for each of the low expansion materials of Samples S5 to S8 is shown in FIG. 5. The thermal expansion coefficient of the low expansion material produced is lowered as the volume percentage of SiC particles is increased, and the thermal expansion coefficient has successfully been changed between $8 \times 10^{-6}$/K and $12 \times 10^{-6}$/K by adjusting the mixture ratio in volume of SiC particles.

As shown in Examples 1 and 2, by choosing the volume percentage of SiC particles in a mold, the Si content of a melt, namely the type of the melt, and the melt temperature, SiC with a thermal expansion coefficient of $4.5 \times 10^{-6}$/K, Al with a thermal expansion coefficient of $25.0 \times 10^{-6}$/K, and precipitated Si with a thermal expansion coefficient of $2.6 \times 10^{-6}$/K are combined to produce a low expansion material of desired thermal expansion coefficient which is suited to an intended use. For example, a low expansion material having a thermal expansion coefficient of $6 \times 10^{-6}$/K to $12 \times 10^{-6}$/K and a heat conductivity of 200 W/m·K or higher can be manufactured.

The thermal expansion coefficient of any low expansion material that is produced in Embodiment 1 depends on the volume percentage of SiC particles in a mold, the Si content of a melt, and the melt temperature but not on the casting method. Accordingly, high pressure casting mentioned above may be replaced by other methods including die casting, oxygen environment die casting (PF method), and reduced pressure casting.

Figure 6:
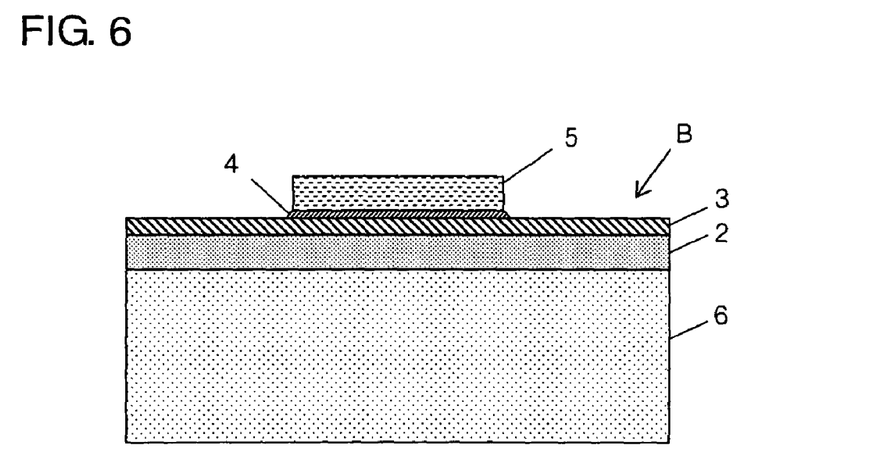
FIG. 6 is a sectional view showing the structure of a semiconductor device according to Embodiment 2 of the present invention.

Embodiment 2:

FIG. 6 shows the structure of a semiconductor device according to Embodiment 2 of the present invention. The above-described method of Embodiment 1 is used to form a substrate 6 from a low expansion material which has, for example, a thermal expansion coefficient of $6 \times 10^{-6}$/K to $12 \times 10^{-6}$/K and a heat conductivity of 200 W/m·K or higher. On a surface of the substrate 6, an insulating layer 2 and a wiring layer 3 are sequentially formed to obtain an Al/SiC circuit board B. A semiconductor element 5 is joined through solder 4 to the top face of the wiring layer 3.

The semiconductor element 5 can be chosen from various elements. For example, a chip resistor has a thermal expansion coefficient of about $7 \times 10^{-6}$/K, a chip capacitor, about $10 \times 10^{-6}$/K, and a Si semiconductor circuit chip, about $2.6 \times 10^{-6}$/K. The substrate 6 therefore is manufactured so as to have a thermal expansion coefficient close to that of the semiconductor element 5 to be mounted thereto, and the Al/SiC circuit board B built from this substrate 6 is used to mount the semiconductor element 5 thereon. This makes it possible to prevent temperature shift from causing a large thermal stress between the Al/SiC circuit board B and the semiconductor element 5 without installing any stress relieving member such as heat spreader therebetween. Accordingly, there is no fear of warping the semiconductor element 5 and cracking the solder 4 when the semiconductor device is used in an automobile or other environment that has a wide temperature range. In this way, a highly reliable semiconductor device is obtained. Using no heat spreader also means that the number of parts is reduced and the structure of the semiconductor device is simplified, resulting in additional effects such as reduction in number of assembling steps and lowering of cost.

Furthermore, the semiconductor device has excellent heat releasing ability because the substrate 6 has as high heat conductivity as pure Al. In particular, since no stress relieving member such as heat spreader is needed, the thermal resistance of the entire semiconductor device can be lowered.

Figure 7:
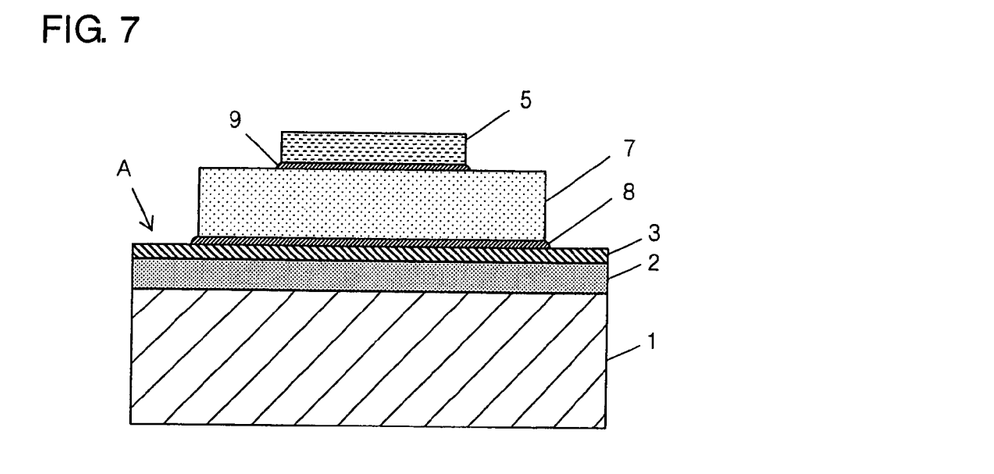
FIG. 7 is a sectional view showing the structure of a semiconductor device according to a modification of Embodiment 2.

FIG. 7 shows the structure of a semiconductor device according to a modification of Embodiment 2. In this semiconductor device, a heat spreader 7 is made from a low expansion material that has a low thermal expansion coefficient and a high heat conductivity by the method of Embodiment 1. The heat spreader 7 is joined through low-temperature solder 8 to the top face of an Al circuit board A composed of a substrate 1, an insulating layer 2 and a wiring layer 3 shown in FIG. 9. A semiconductor element 5 is joined to the top face of the heat spreader 7 through high-temperature solder 9. The heat spreader 7 improves release of heat from the semiconductor element 5 and relieves thermal stress generated between the Al circuit board A and the semiconductor element 5.

Figure 8:
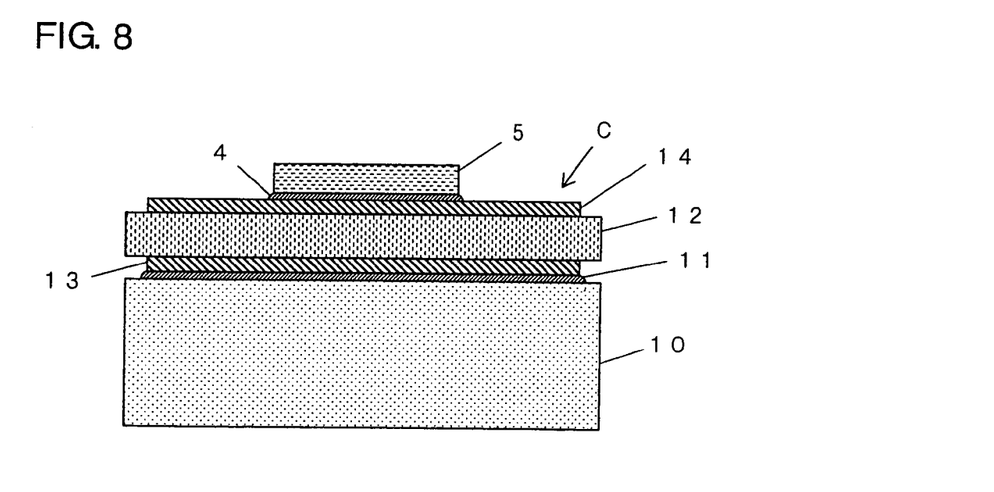
FIG. 8 is a sectional view showing the structure of a semiconductor device according to another modification of Embodiment 2.

FIG. 8 shows the structure of a semiconductor device according to another modification of Embodiment 2. In this semiconductor device, a heat releasing plate 10 is made from a low expansion material that has a low thermal expansion coefficient and a high heat conductivity by the method of Embodiment 1. The heat releasing plate 10 is joined through solder 11 to the bottom face of a ceramic circuit board C. A semiconductor element 5 is joined to the top face of the ceramic circuit board C through solder 4. The ceramic circuit board C includes a ceramic substrate 12 formed of ceramics such as AlN or alumina, and Al wiring layers 13 and 14 formed on both sides of the ceramic substrate 12.

The thermal expansion coefficient of the ceramic circuit board C is about $5 \times 10^{-6}$/K. The heat releasing plate 10 is manufactured so as to have a thermal expansion coefficient that is close to the thermal expansion coefficient of the ceramic circuit board C by choosing the volume percentage of SiC particles in a mold, the Si content of a melt, and the melt temperature properly. With such heat releasing plate 10 joined to the ceramic circuit board C, release of heat from the semiconductor element 5 is improved and a large thermal stress between the ceramic circuit board C and the heat releasing plate 10 can be avoided.

As has been described, the present invention makes it possible to easily produce at low cost a low expansion material that is low in thermal expansion coefficient while having excellent heat conductivity, because a melt of Al or of an Al alloy containing Si is cast in a mold filled with unsintered SiC particles.

A semiconductor device according to the present invention has a substrate, heat spreader, or heat releasing plate made of the above low expansion material. This relieves thermal stress in the semiconductor device and gives the semiconductor device an excellent heat dissipating ability, thereby improving the reliability.

What is claimed is:

1. A semiconductor device comprising:
    a circuit board;
    a heat spreader which is formed of a low expansion material including two or more kinds of SiC particles having different mean grain sizes and an Al material, the heat spreader being joined to the top face of the circuit board; and a semiconductor element mounted onto the heat spreader;

wherein the two or more kinds of SiC particles having different mean grain sizes comprise SiC particles with a mean grain size of 100 microns and SiC particles with a mean grain size of 8 microns.

2. A semiconductor device as claimed in claim 1, wherein the circuit board is composed of a metal substrate with an insulating layer and a wiring layer formed on its surface in order, the heat spreader being joined to the top face of the wiring layer through solder, the semiconductor element being joined to the top face of the heat spreader through solder.

* * * * *

UNITED STATES PATENT AND TRADEMARK OFFICE
CERTIFICATE OF CORRECTION

PATENT NO. : 7,196,417 B2  
APPLICATION NO. : 10/626418  
DATED : March 27, 2007  
INVENTOR(S) : Tomohei Sugiyama et al.

Page 1 of 1

It is certified that error appears in the above-identified patent and that said Letters Patent is hereby corrected as shown below:

Column 1, line 28, please delete "in thermal" and insert therefore -- in the thermal --;

Column 1, line 29, please delete "Si or other" and insert therefore -- Si or any other --;

Column 1, line 30, please delete "5 and Al" and insert therefore -- 5, and Al --;

Column 2, line 60, please delete "unsintered Sic particles" and insert therefore -- unsintered SiC particles --;

Column 2, line 67, please delete "expan" and insert therefore -- expan- --;

Column 4, line 5, please delete "as low thermal" and insert therefore -- as low a thermal --;

Column 4, line 55, please delete "The mold/melt temperature is set to" and insert therefore -- The mold/melt temperature is set to 700/800°C for each of Samples S5 to S8. --;

Column 5, line 61, please delete "as heat spreader" and insert therefore -- as a heat spreader --; and Column 6, line 7, please delete "as heat spreader" and insert therefore -- as a heat spreader --.

Signed and Sealed this

Thirteenth Day of October, 2009

David J. Kappos  
*Director of the United States Patent and Trademark Office*